(12) United States Patent
Holzapfel et al.

(10) Patent No.: US 6,452,159 B2
(45) Date of Patent: Sep. 17, 2002

(54) POSITION MEASURING SYSTEM

(75) Inventors: Wolfgang Holzapfel, Obing; Ullrich Benner, Trostberg, both of (DE)

(73) Assignee: Johannes Heidenhain GmbH, Traunreut (DE)

( * ) Notice: Subject to any disclaimer, the term of this patent is extended or adjusted under 35 U.S.C. 154(b) by 21 days.

(21) Appl. No.: 09/741,765

(22) Filed: Dec. 19, 2000

(30) Foreign Application Priority Data

Dec. 23, 1999 (DE) .......................................... 199 62 278

(51) Int. Cl.[7] .............................................. G01B 11/14
(52) U.S. Cl. ........................... 250/231.13; 250/231.14; 250/237 G; 341/11; 356/616; 356/617; 356/619
(58) Field of Search ....................... 250/231.13, 231.14, 250/237 R, 237 G; 341/11, 13; 356/614–619

(56) References Cited

U.S. PATENT DOCUMENTS

| | | | | |
|---|---|---|---|---|
| 3,591,841 A | * | 7/1971 | Heitmann | 250/231.14 |
| 4,101,764 A | | 7/1978 | Nelle | 250/237 G |
| 4,363,964 A | | 12/1982 | Schmitt | 250/237 G |
| 4,403,859 A | | 9/1983 | Ernst | 356/619 |
| 4,459,750 A | | 7/1984 | Affa | 33/707 |
| 4,462,159 A | | 7/1984 | Nelle | 33/679.1 |
| 4,479,716 A | | 10/1984 | Nelle | 356/619 |
| 4,491,928 A | | 1/1985 | Reichl | 702/161 |
| 4,519,140 A | | 5/1985 | Schmitt | 33/706 |
| 4,573,000 A | | 2/1986 | Nelle | 318/640 |
| 4,606,642 A | | 8/1986 | Nelle | 356/619 |
| 4,654,527 A | | 3/1987 | Schmitt | 250/237 G |
| 4,701,615 A | | 10/1987 | Schmitt | 250/237 G |
| 4,778,273 A | | 10/1988 | Michel | 356/619 |
| 4,793,067 A | | 12/1988 | Reimar et al. | 33/707 |
| 4,999,623 A | | 3/1991 | Affa | 341/13 |
| 5,235,181 A | * | 8/1993 | Durana et al. | 250/231.18 |
| 5,252,825 A | | 10/1993 | Imai et al. | 250/231.18 |
| 5,428,445 A | | 6/1995 | Holzapfel | 356/499 |
| 5,553,390 A | | 9/1996 | Ernst et al. | 33/706 |
| 5,651,187 A | | 7/1997 | Affa | 33/706 |
| 5,689,336 A | | 11/1997 | Huber | 356/499 |
| 5,739,911 A | * | 4/1998 | Holzapfel et al. | 356/620 |
| 5,977,539 A | | 11/1999 | Holzapfel et al. | 250/237 G |
| 5,994,692 A | | 11/1999 | Holzapfel | 250/237 G |
| 6,031,224 A | * | 2/2000 | Peterlechner | 250/231.13 |
| 6,097,490 A | | 8/2000 | Holzapfel et al. | 356/614 |
| 6,198,534 B1 | * | 3/2001 | Höfer et al. | 356/399 |

FOREIGN PATENT DOCUMENTS

| | | |
|---|---|---|
| DE | 195 05 176 | 8/1995 |
| GB | 2 116 313 | 9/1983 |

OTHER PUBLICATIONS

Pending Patent Application Assigned to Dr. Johannes Heidenhain GmbH; Ser. No.: 09/652,220, Filing Date: Aug. 30, 2000, Inventor: Holzapfel et al.

Pending Patent Application Assigned to Dr. Johannes Heidenhain GmbH; Ser. No.: 09/661,663, Filing Date: Sep. 14, 2000, Inventor: Spanner.

Pending Patent Application Assigned to Dr. Johannes Heidenhain GmbH; Ser. No.: 09/832,358, Filing Date: Apr. 09, 2001, Inventor: Mayer et al.

* cited by examiner

Primary Examiner—Robert H. Kim
Assistant Examiner—Allen C. Ho
(74) Attorney, Agent, or Firm—Brinks Hofer Gilson & Lione

(57) ABSTRACT

A position measuring system that includes a scale having an incremental track, which extends in a measuring direction and has an incremental graduation with two different graduation periods. A scanning unit moves in relation to the scale in a measuring direction, the scanning unit has an incremental signal detection arrangement, wherein the incremental signal detection arrangement generates incremental signals with a first coarse signal period and generates incremental signals with a second finer signal period.

27 Claims, 9 Drawing Sheets

POSITION MEASURING SYSTEM

Applicants claim, under 35 U.S.C. §119, the benefit of priority of the filing date of Dec. 23, 1999 of a German patent application, copy attached, Serial Number 199 62 278.7, filed on the aforementioned date, the entire contents of which is incorporated herein by reference.

BACKGROUND OF THE INVENTION

1. Field of the Invention

The invention relates to a position measuring system, having a scale and a scanning unit, which can be moved in relation to the scale in the measuring direction.

2. Discussion of Related Art

A first category of known devices for absolute position determination includes an absolute track on the scale side for coarse position determination, as well as several incremental tracks for the incremental position determination at higher resolution. In connection with such measuring systems for absolute position determination, reference is made, for example, to FIG. 6 in U.S. Pat. No. 5,252,825. Known serial pseudo-random codes can be employed for absolute position determination, for example. The further incremental tracks customarily include incremental graduations with graduation periods which are stepped with respect to each other, starting with a coarse incremental graduation period and up to a fine incremental graduation period. The finest incremental graduation period finally determines the maximum resolution of such a measuring system. Appropriate processing of the scanning signals of the different tracks is required during measuring operations in order to have the desired absolute position available at the output side. The several tracks extend on the scale parallel with each other in the measuring direction. Rotary, as well as linear measuring arrangements on the basis of this principle are known in this connection. Accordingly, different widths of the scales are therefore required, depending on the number of incremental tracks. In the same way, several detector elements per track are required for the scanning unit, which is movable with respect to the scale. With a correspondingly large number of incremental tracks, a voluminous structure results as a whole. For example, in case of a rotary system, a correspondingly large diameter of the graduation disk is required. Thus, problems sometimes arise under restricted installation conditions.

Furthermore, difficulties can arise if a metal strip is used as the scale carrier in the described systems. Erroneous measurements thus result if such a metal strip is not aligned exactly parallel with the measuring direction, and the various graduation tracks are twisted around an axis which is located perpendicular to the graduation plane. In this case processing the signals from the various tracks, and the absolute position determination from these signals can sometimes become problematical.

Furthermore, a multitude of incremental tracks require a large illuminated area on both sides of the scale, i.e. a relatively low illumination strength per unit of area exists on the scanned scale. The results of this are scanning signals with small signal amplitude, which are therefore susceptible to failure.

However, a second category of known devices for absolute position determination includes merely a single incremental track arranged parallel adjacent to an absolute track with a serial absolute coding. In this connection, reference is made to DE 195 05 176 A1, for example. Although the above-mentioned problems in connection with the structural size are avoided in such a variation, a clearly reduced resolution in the course of the position determination results in comparison with the above discussed systems. If, on the other hand, the resolutions of the incremental track and the absolute track are selected to be too different, problems result in particular in the synchronization of the signals from the different tracks.

Moreover, with such systems the use of metal strips for the scale is not without problems, since again wrong measurements can occur with the synchronization of the signals from the incremental track and the neighboring absolute track in case of metal strips which are not oriented parallel with the measuring direction. Basically the always necessary synchronization of the signals from the track with the highest resolution with the signals from the track with the next highest resolution is most critical here. Errors in this synchronization result in particular in cases, were twisting of the scale occurs around an axis which is oriented perpendicularly in relation to the scale surface. Such twisting as a rule occurs along thin metal strips, since they cannot be cut straight enough because of their lack of stiffness.

But the above discussed problems do no only occur in the described categories of absolute position measuring with a serially coded absolute track. Similar problems also exist in connection with rotary position measuring systems which, besides a high resolution incremental track, furthermore have an incremental track which provides an output signal with a single signal period in the course of one revolution.

OBJECT AND SUMMARY OF THE INVENTION

It is therefore an object of the present invention to indicate a position measuring system of compact structure, which will provide several incremental signals of different resolution, if possible, from scanning an incremental track.

This object is attained by a position measuring system that includes a scale having an incremental track, which extends in a measuring direction and has an incremental graduation with two different graduation periods. A scanning unit moves in relation to the scale in a measuring direction, the scanning unit has an incremental signal detection arrangement, wherein the incremental signal detection arrangement generates incremental signals with a first coarse signal period and generates incremental signals with a second finer signal period.

The position measuring system in accordance with the present invention thus permits the generation of at least two incremental signals of different resolution while scanning only one incremental track.

A variation of the position measuring system of the invention, which in particular is suitable for absolute position determination, only includes two separate tracks. One of the two tracks is embodied as an absolute track and in the course of scanning provides coarse absolute position information. However, the second one of the two tracks, i.e. the incremental track, comprises an incremental graduation with at least two different graduation periods, and in the course of scanning provides at least two separate incremental signals with different signal periods. It is therefore possible to derive at least two incremental signals of different resolution from a single incremental track without the structural size of the total system becoming too large.

Moreover, the position measuring system in accordance with the present invention has been shown to be relatively indifferent to possible tilting of the scanning unit with respect to the scanned scale. With the above discussed categories of absolute position measuring systems in particular, the above mentioned synchronization of the signals from the track with the highest resolution with the signals of the track with the next highest resolution is now less critical, since these signals are obtained from a single, or common, track. This means that it is also possible to employ metal strips as the scale carrier. Because of this indifference to tilting or twisting of the scanning unit with respect to the scale, extreme demands are no longer made on mechanical components, such as machine guideways etc., which are employed in connection with the system in accordance with the invention.

It should be furthermore pointed out that in the case of optical scanning, a smaller illuminated field is sufficient for signal generation as a whole because of the reduced lateral dimensions of the two tracks. This in turn results in a greater illumination strength per unit of surface, and therefore a greater signal strength, or reduced susceptibility to failure.

Although embodiments of the position measuring system of the present invention will be described in what follows, each of which is based on optical, or photoelectric, scanning, it should be pointed out here that the present invention can of course also be carried out in connection with other physical scanning principles. It should also be mentioned that the system of the invention can be designed as a linear, as well as a rotary position measuring system.

It is of course also possible to provide, besides the exemplary embodiments of absolute position measuring systems explained in detail in what follows, alternative position measuring systems. For example, a rotary system with only a single incremental track is conceivable, whose scanning provides a first coarse incremental signal with one signal period per revolution, and a second, high-resolution incremental signal, etc.

Further advantages of the present invention ensue from the subsequent description of exemplary embodiments by means of the attached drawings.

BRIEF DESCRIPTION OF THE DRAWINGS

FIG. 1b is a top plan view of the embodiment of the scale shown in FIG. 1a;

FIG. 1d is a top plan view of the embodiment of the scanning plate of the scanning unit in the position measuring system shown in FIG. 1a;

FIG. 1e is a plan view of the detection plane of the embodiment of the scanning unit shown in FIG. 1a;

FIG. 2b is a top plan view of the embodiment of the scale shown in FIG. 2a;

FIG. 2c is a plan view of the detection plane of the embodiment of the scanning unit shown in FIG. 2a;

FIG. 2d is a schematic representation of the detection plane of the embodiment of the scanning unit in the position measuring system shown in FIG. 2a;

DETAILED DESCRIPTION OF THE PREFERRED EMBODIMENTS

A first exemplary embodiment of the position measuring system will be explained in what follows by means of FIGS. 1a to 1g. This is a device for absolute position determination.

Figure 1A:
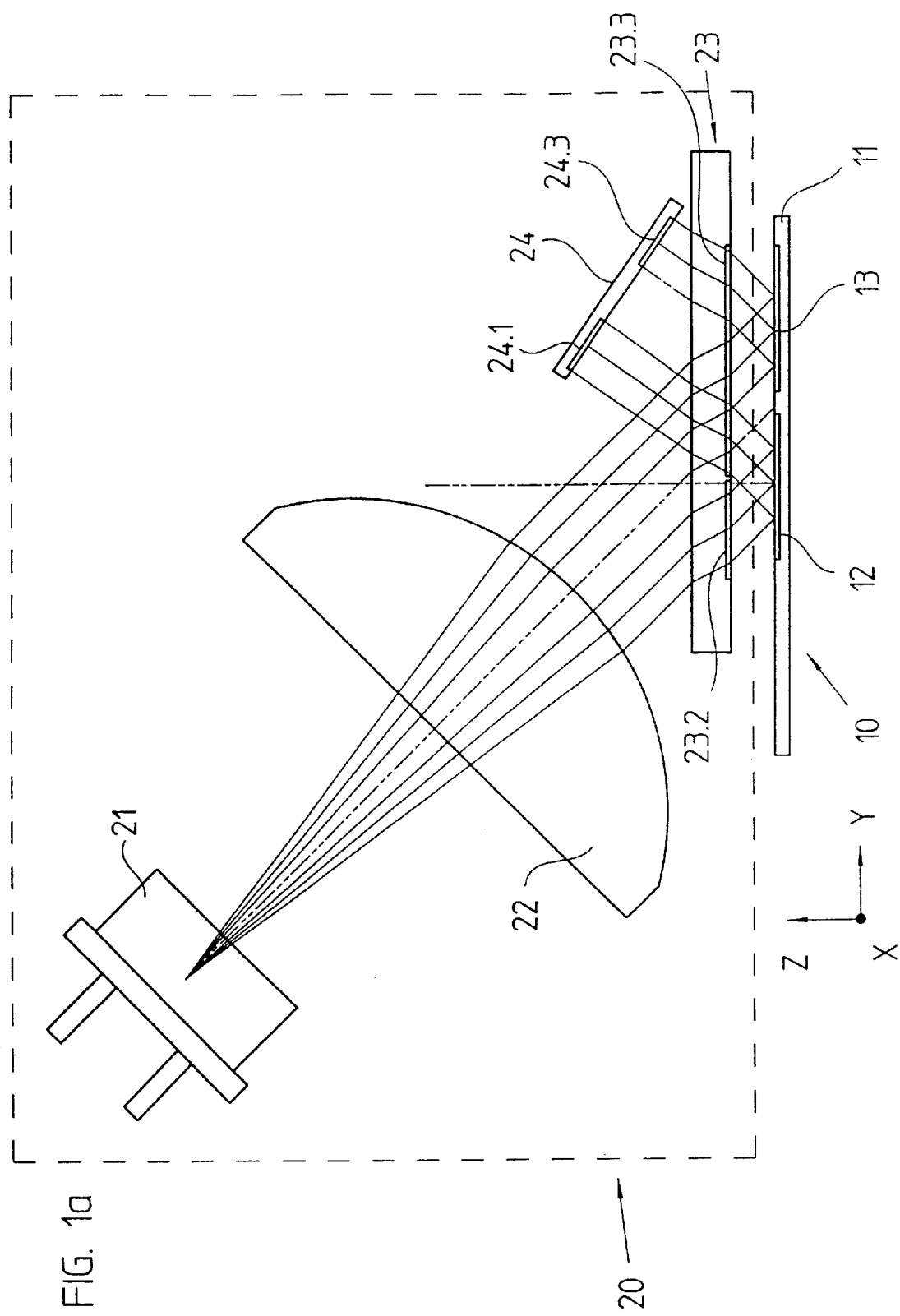
FIG. 1a is a schematic representation of the path of the scanning beams in a first exemplary embodiment of the position measuring system according to the present invention.

Here, FIG. 1a shows the principal path of the scanning beams of the position measuring system of the present invention, which is designed as a linear incident light measuring system. The position measuring system includes a scale 10 extending in the measuring direction x, as well as a scanning unit 20, which is movable with respect to the scale 10 in the measuring direction x. In the representation shown in FIG. 1a, the measuring direction x is oriented perpendicularly with respect to the drawing plane. The scale 10 and the scanning unit 20 are connected with machine elements, which are movable with respect to each other, for example, and whose positions in relation to each other are to be determined. These can be, for example, a tool and a workpiece in a numerically controlled machine tool. In this case, the signals generated by the position measuring system in accordance with the present invention are further processed in a machine tool control device, not represented.

In this embodiment, the scale of the position measuring system of the present invention includes two tracks 12, 13, which are arranged on a scale carrier 11 and are scanned by the scanning unit 20 for the absolute position detection. The two tracks 12, 13 extend in the measuring direction x and, in the represented incident light variation of the position measuring system, each includes a sequence of partial areas of different reflection properties, namely of partial areas of high reflectivity and partial areas of low reflectivity.

Figure 1B:
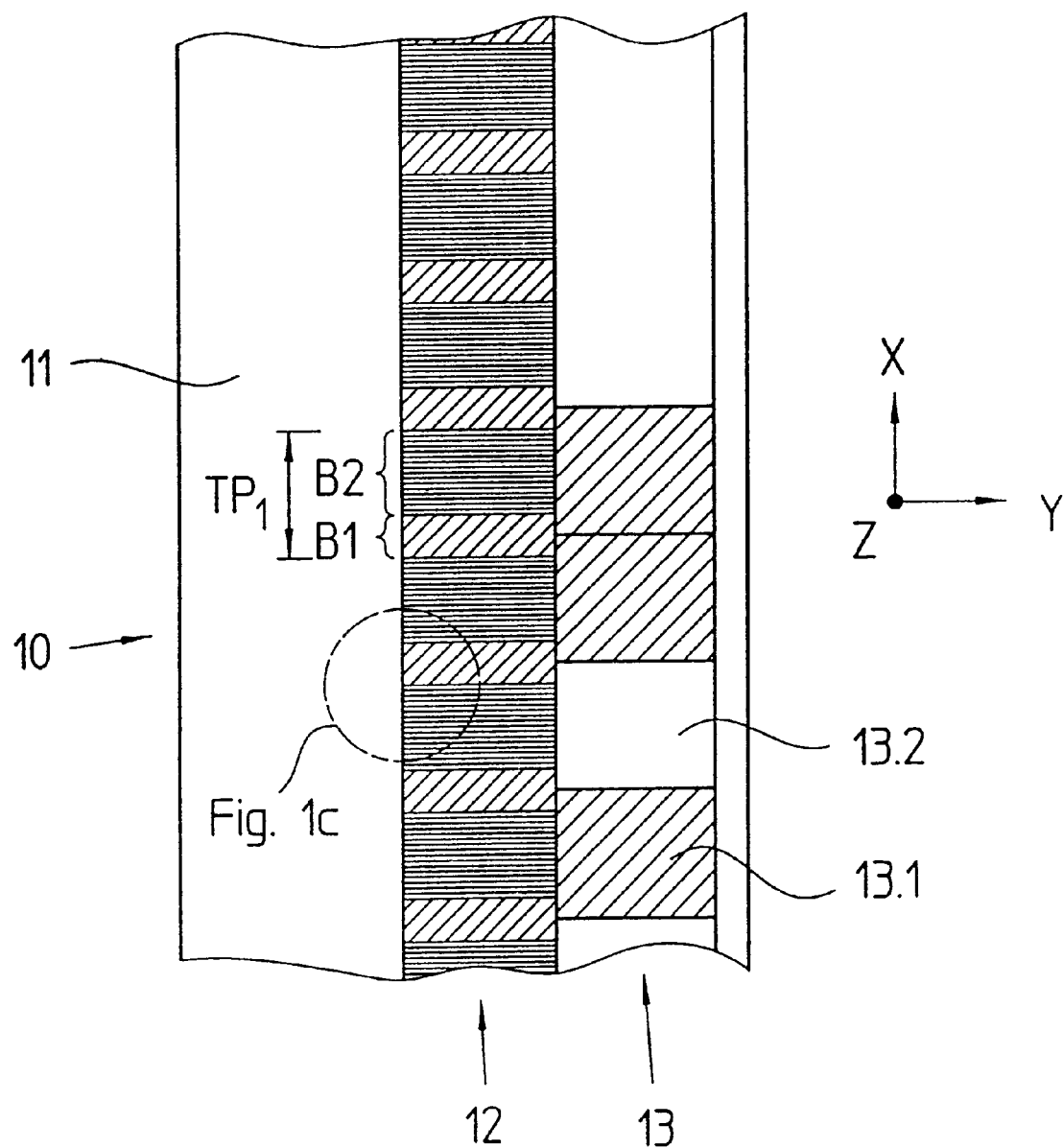

The shape of the two tracks 12, 13 of the first exemplary embodiment can be seen in the top plan view in FIG. 1b. A first track 13, hereinafter called absolute track 13, has an absolute coding in the form of a pseudo-random code. The pseudo-random code includes an a periodic sequence of high-reflecting and low-reflecting partial areas 13.1, 13.2, each of which has the same width in the measuring direction x. A coarse absolute position signal ABS can be generated in a known manner from scanning the absolute track 13, but its resolution is not yet sufficient for the desired highly precise position measurement. It is of course also possible to alternatively provide serial codings in the absolute track 13, such as block codes, Manchester codes, etc.

The second track 12, which hereinafter will be called the incremental track 12, is arranged directly adjoining and parallel to the absolute track 13. The same as the absolute track 13, the incremental track 12 also extends in the measuring direction x. The incremental track 12 is used for generating periodic incremental signals INC1, INC2 of higher resolution, which are employed in a known manner for determining the relative positions of the scale 10 and the scanning unit 20. In this variation, the incremental signals INC1, INC2 are combined in a suitable manner with the absolute position signals ABS from the absolute track 13 in order to determine in this way the absolute position of the parts which can be moved with respect to each other. It is possible here that the determination of the respective absolute position from the different scanning signals can already be performed at the position of the measuring system, or only later in a downstream connected evaluation unit, for example a numerical machine tool control.

In accordance with the present invention, the incremental track 12 in the exemplary embodiment permits the generation of incremental signals INC1, INC2 with two different signal periods SP1, SP2. The scanned incremental track 12 has two different graduation periods $TP_1$, $TP_2$ for this purpose. The incremental track 12 in this exemplary embodiment includes a periodic sequence of first and second blocks B1, B2. The graduation period $TP_1$, which represents the coarser one of the two graduation periods $TP_1$, $TP_2$ in the incremental track 12, is defined by the sum of the width of two successive blocks B1, B2. In this embodiment the widths of the two blocks B1, B2 have not been selected to be identical. However, the coarse graduation period $TP_1$, defined by the sum of the widths, is mainly important for scanning. Depending on the type of scanning of the incremental track 12, it can also be advantageous to embody the blocks B1, B2 to be of identical width.

Figure 1C:
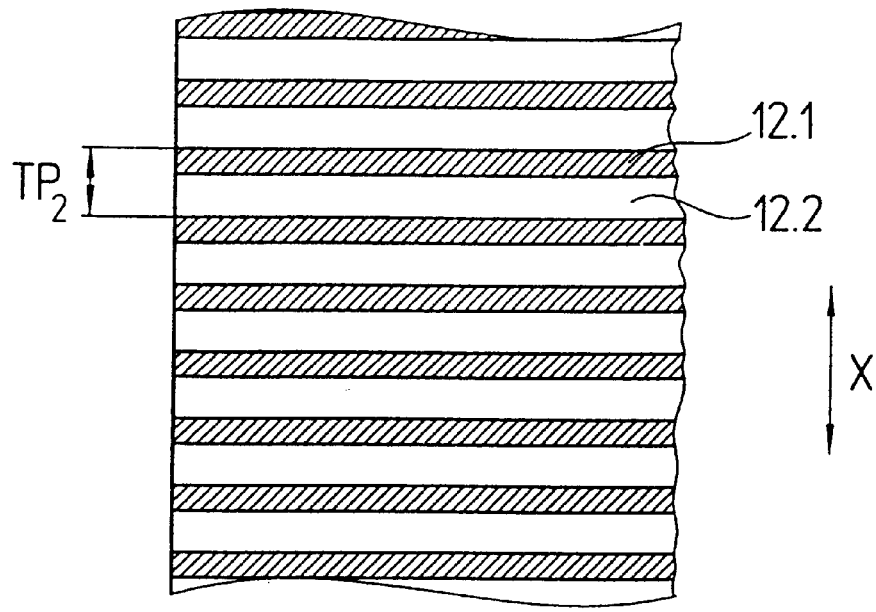
FIG. 1c is an enlarged section from FIG. 1b.

In the variation represented, the first blocks B1 are embodied to be low-reflecting, however, the second blocks B2 include a periodic sequence of further partial areas 12.1, 12.2 with low-reflecting and high-reflecting optical properties. An enlarged partial representation of a second block B2 is shown in FIG. 1c. As can be seen in FIG. 1c, the partial areas 12.1, 12.2 in the second blocks B2 are designed as narrow rectangular-shaped areas, whose longitudinal axes extend in the y-direction in the scale plane, i.e. are oriented perpendicularly in relation to the measuring direction x. Each one of the different partial areas 12.1, 12.2 in the second blocks B2 has the identical dimensions. The fine graduation period $TP_2$ of the incremental track 12 is defined by the sum of two successive partial areas 12.1, 12.2 in the first blocks B1, which is also illustrated in FIG. 1c.

In the embodiment of the position measuring system represented, the fine graduation period $TP_2$ of the incremental track 12 has been selected to be smaller by a factor of 10 than the coarser graduation period $TP_1$ of the incremental track 12, i.e. $TP_1=200$ μm and $TP_2=20$ μm.

In principle, the coarser graduation period $TP_1$ of the incremental track 12 should be selected as a whole number multiple of the finer graduation period $TP_2$. Only in this way is it assured that successive blocks B2 represent portions of a continuous incremental graduation with the finer graduation period $TP_2$. Accordingly, it must always be assured that low-reflecting partial areas 12.1 and high-reflecting partial areas 12.2 are alternatingly arranged over the entire measurement distance. This applies in particular if the low-reflecting blocks B1 interrupt the incremental graduation with the finer graduation period $TP_2$. Thus, a high-reflecting partial area 12.2 in the block B2 immediately adjoining in the measuring direction follows a low-reflecting partial area 12.1 at the edge of a block B2. Incidentally, the representation of the incremental track 12 in FIG. 1b does not show this in detail.

In this exemplary embodiment, the bit width of the pseudo-random code of the absolute track 13 is furthermore matched to the coarser graduation period $TP_1$ of the incremental graduation 12. This means that the width in the measuring direction x of the partial areas 13.1, 13.2 in the absolute track 13 has been selected to be identical with the graduation period $TP_1$ of the incremental track 12.

Alternatively with the explained embodiment of the scale 10 it is of course also possible to design the various partial areas of the two tracks 12, 13 on the scale carrier 11 to have other optical properties, i.e. to possibly interchange the high-and low-reflecting partial areas. In the same way the explained embodiment of a scale can also be transferred to a transmitted light system. In this case it would then be necessary to design the respective partial areas in the two tracks to be transparent and non-transparent. Moreover, it can principally also be provided to design the incremental tracks in such a way that more than two incremental signals with different signal periods can be obtained from them.

The scanning unit 20, which is also schematically represented in FIG. 1a, includes a light source 21, for example an LED, an optical collimation device 22, a scanning plate 23, as well as a detector unit 24 for detecting the various scanning signals. The paths of the scanning beams for generating the incremental signals INC1, INC2, as well as the absolute position signal ABS, will be separately explained in what follows.

Figure 1D:
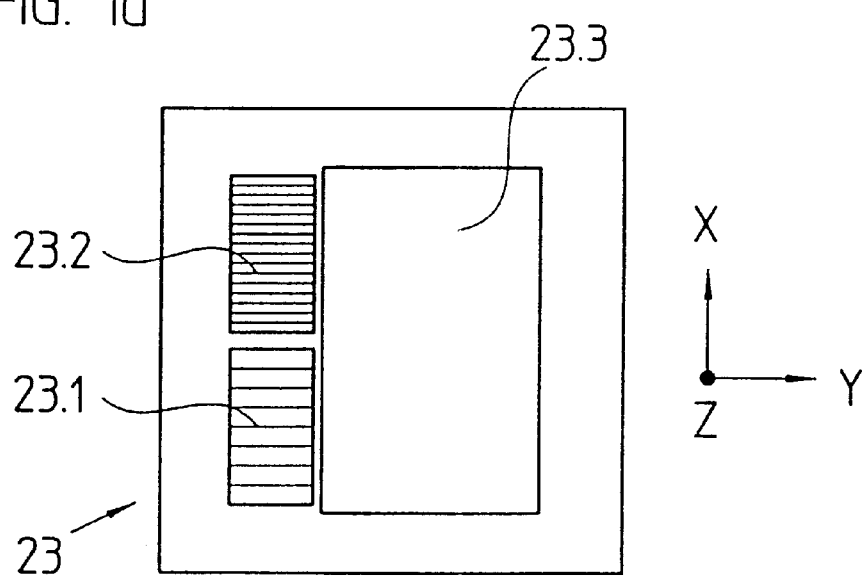

In the first embodiment represented, following collimation the light beams emitted by the light source 21, which aid in the generation of the various incremental signals, reach the two scanning graduations 23.1, 23.2 in the scanning plate 23 via the optical collimation device 22. A top plan view of the scanning plate 23 is represented in FIG. 1d. The two scanning graduations 23.1, 23.2 have different scanning graduation periods $ATP_1$, $ATP_2$, which are matched to the two graduation periods $TP_1$, $TP_2$ of the incremental track 12. Here, the first scanning graduation 23.1 is matched to the coarser graduation period $TP_1$ and is used to generate the incremental signals INC1 with the coarser signal period SP1. In a possible embodiment, the corresponding scanning graduation period $ATP_1$ is selected to be slightly different from the coarser graduation period $TP_1=200$ μm. But the scanning graduation period $ATP_2$ of the second scanning graduation 23.2 in the scanning plate 23 is matched to the finer graduation period $TP_2$ in the incremental track 12 and is used for generating the incremental signals INC2 of the finer signal period SP2. The scanning graduation period $ATP_2$ of the second scanning graduation 23.2 is selected to be slightly different from the finer graduation period $TP_2=20$ μm.

The first scanning graduation 23.1 with the coarser scanning graduation period $ATP_1$ is embodied purely as an amplitude grating. The second scanning graduation 23.2 with the finer scanning graduation period $ATP_2$, however, is designed as a combined phase/amplitude grating, such as described in German Patent Application 199 41 318.5. Such a design of the second scanning graduation 23.2 assures that a defined invariability of the measuring system against possible fluctuations of the scanning distance is provided.

Following passage through the two scanning graduations 23.1, 23.2, the respective beams impinge on the incremental track 12 on the scale 10 and are there reflected back in the direction toward the scanning plate 23. The reflected beams pass through a transparent window area in the scanning plate 23 before impinging on the respective incremental signal detector arrangements 24.1, 24.2 in the detector unit 24. Only one of the two detector arrangements 24.1, 24.1 of this exemplary embodiment can be seen in FIG. 1a, so that reference is made to the schematic top plan view on the detection plane in FIG. 1e with respect to the actual construction of the detector unit 24. As can be seen there, a first incremental signal detector arrangement 24.1 is provided for the detector unit 24 for generating the incremental signals INC1 with the coarse signal period SP1, as well as a second incremental signal detector arrangement 24.2 for generating the incremental signals INC2 with the fine signal period SP2. Respectively, one pair of incremental signals INC1, INC2 with the coarse and fine signal periods SP1, SP2 is of course generated on the output side, wherein these are respectively phase-shifted by 90. Regarding the detailed design of the detector unit 24, reference is made to the still to follow detailed description of FIG. 1e.

The beams, which in this example are used for generating the coarse absolute position signals ABS pass, after collimation by the optical collimation device 22, through the transparent window area 23.3 of the scanning plate 23 and reach the absolute track 13 on the scale 10. A reflection back in the direction of the scanning plate 23 takes place from there, where the reflected beams again pass through the transparent window area before impinging on the absolute position signal detector arrangement 24.3 in the detector unit 24. Thus, in a known manner only an image or shadow projection of the respectively just detected section of the pseudo-random code on the absolute position signal detector arrangement 24.3 is provided by this path of the beams.

Figure 1E:
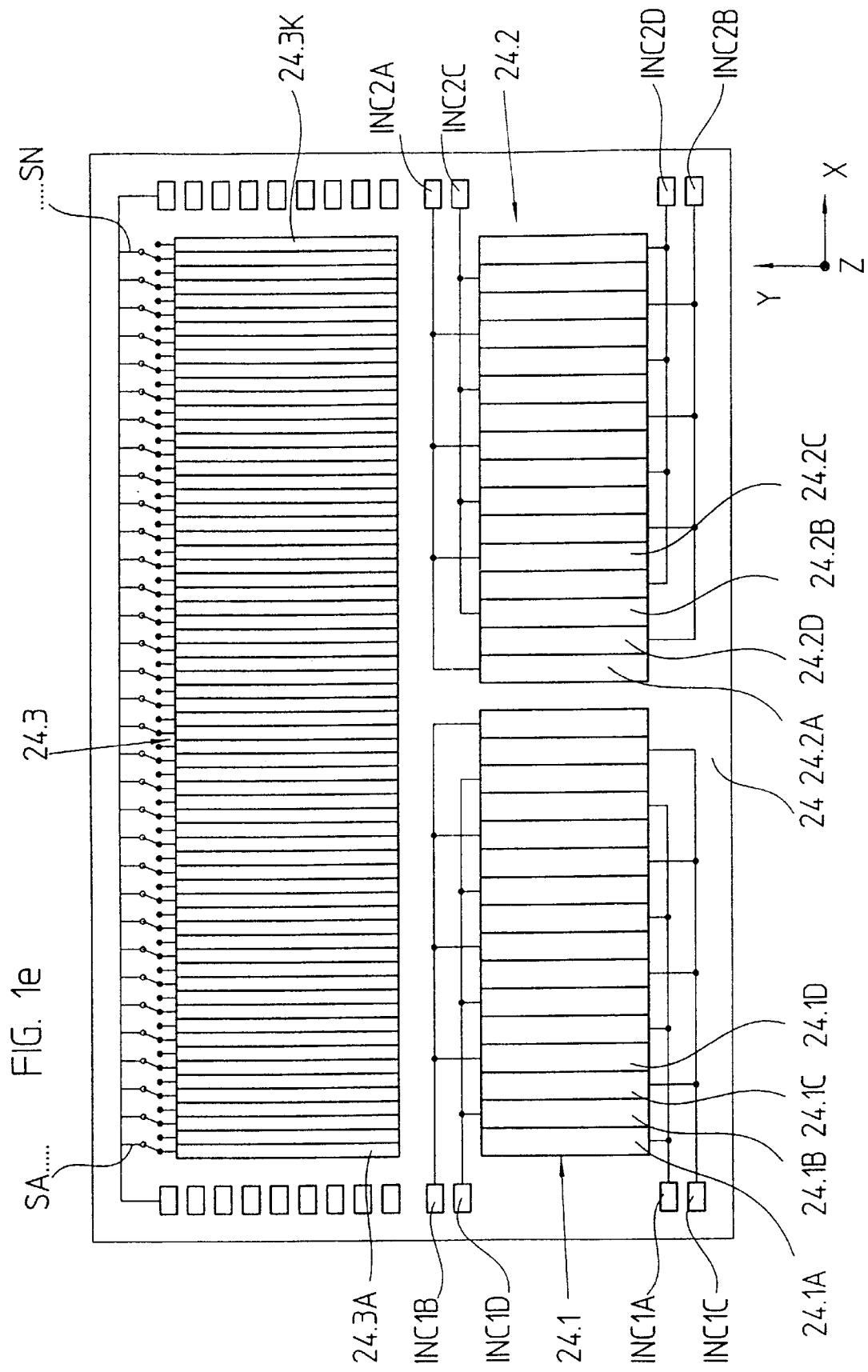

A plan view of the detection plane of the detector unit 24 is represented in a schematic form in FIG. 1e. Here, the absolute position signal detector arrangement 24.3, which includes a multitude of individual opto-electronic detector elements 24.3A to 24.4K, which are arranged following each other in the measuring direction x, can be seen in the upper part. In the exemplary embodiment represented, respectively two adjoining detector elements are used for scanning a bit of the pseudo-random code in the absolute track 13, i.e. there are two groups of detector elements 24.3A to 24.4K, which are used for scanning the bits of the pseudo-random code. However, only respectively one of the two detector elements 24.3A to 24.3K per bit is read out during measuring operations, which is intended to be illustrated in FIG. 1e by the schematically indicated circuit elements SA to SN above the detector elements 24.3A to 24.3K. In the present exemplary embodiment, one such circuit element SA to SN is therefore assigned to two detector elements 24.3A to 24.3K, which are assigned to one bit width. In this case the selective readout of the respective detector elements takes place as a function of which of the two groups of detector elements 24.3A to 24.3K is located closer to the center of the respective bit fields of the pseudo-random code. During measuring operations, the incremental signal INC1 with the coarser signal period SP1 is used to decide this.

The scanning signals, which are generated in the detector elements 24.3A to 24.3K of the absolute position signal detector arrangement 24.3, are respectively fed to trigger elements, not represented, which provide signals with logical HIGH and LOW levels on their output side, which are further processed for the absolute position determination. The trigger elements are also preferably arranged in integrated form on the carrier substrate of the detector unit 24. For generating the output signals, a reference signal is moreover present at the trigger elements, which either has a constant signal level, or is varied in a known manner as a function of the signal level of the scanning signals. The output signals of the trigger elements are conducted to a signal processing unit, also not represented, which further processes them, as well as the generated incremental signals, and generates an output signal ABS, which delivers the desired coarse absolute position.

The two incremental signal detector arrangements 24.1, 24.2 of the detector unit 24 can be seen in the lower portion of the plan view in FIG. 1e which, in this exemplary embodiment, are used for scanning the incremental track and for generating the incremental signals INC1, INC2 with the signal periods SP1, SP2. The incremental signal detector arrangement 24.1, shown on the left in FIG. 1e, is used for generating the coarser incremental signal INC1, while the incremental signal detector arrangement 24.2 shown on the right is employed for generating the finer incremental signal INC2.

The two incremental signal detector arrangements 24.1, 24.2 basically have the same structure, and are each designed as so-called structured detector arrangements, or detector arrangement arrays. In a known manner, these include a plurality of individual opto-electronic elements 24.1A, 24.1B . . . , 24.2A, 24.2B . . . , all of which are identically embodied in the incremental signal detector arrangement 24.1, 24.2 and are arranged, adjoining each other, in the measuring direction x. Those detector elements 24.1A, 24.1B . . . , 24.2A, 24.2B . . . of a detector arrangement 24.1, 24.2, which provide scanning signals of identical phase, are respectively wired together at the output side. In the represented embodiment, the fifth detector elements in the two detector arrangements 24.1, 24.2 are respectively wired together, so that a total of four partial increment signals $INC1_A$, $INC1_B$, $INC1_C$, $INC1_D$, $INC2_A$, $INC2_B$, $INC2_C$, $INC2_D$, which are respectively phase-shifted by 90, are provided per detector arrangement 24.1, 24.2 on their output sides. For generating the two incremental signals $INC1_0$, $INC1_{90}$, or $INC2_0$, $INC2_{90}$, which are phase-shifted by 90, these are then differentially connected in a known manner, which is not represented in FIG. 1e, so that respectively one pair of incremental signals, phase-shifted by 90, results per detector arrangement 24.1, 24.2. For the sake of simplicity, only one respective incremental signal INC1, INC2 was mentioned above, this will also be continued in the further course of the description.

Periodic fringe patterns respectively appear in the detection plane in the area of the two incremental signal detector arrangements 24.1, 24.2, which are the result of the interaction of the beams emitted by the light source 21 with the incremental tracks 12, as well as with the respective scanning graduations 23.1, 23.2 in the scanning plate 23. Because of the slightly different graduation periods $TP_1$ and $ATP_1$, or $TP_2$ and $ATP_2$, the periods of the respectively associated fringe patterns are clearly larger than $TP_1$ and $TP_2$.

These fringe patterns will be called Vernier fringe patterns in what follows. The same as the graduation structures, the resultant Vernier fringe patterns are oriented in the incremental track 12, or in the scanning graduations 23.1, 23.2. In case of a relative movement between the scale 10 and the scanning unit 20, the Vernier fringe patterns created in this way wander in the measuring direction x over the respective incremental signal detector arrangement 24.1, 24.2, which provide the incremental signals INC1, INC2, which are modulated as a function of the displacement. Because of the dimensioning of the scanning graduations 23.1, 23.2, the Vernier fringe patterns move at different speeds over the respective incremental signal detector arrangement 24.1, 24.5 when the scale 10 and the scanning unit 20 move in relation to each other. Therefore periodic incremental signals INC1, INC2 with different signal periods SP1, SP2, which in this example differ by approximately a factor of 10, are present at the different detector arrangements 24.1, 24.2.

Because of the dimensioning of the scanning graduations 23.1, 23.2 selected in this embodiment which, as mentioned above, are matched to the two incremental graduation periods $TP_1$, $TP_2$, Vernier fringe patterns of equal periodicity result on the two incremental signal detector arrangements 24.1, 24.2. The periods of the Vernier fringe patterns which are identical on the two incremental signal detector arrangements 24.1, 24.2, will be identified by $\Lambda$ in what follows. The resultant Vernier fringe pattern VS is represented in connection with a portion of the incremental signal detector arrangement 24.1 in FIG. 1f.

In principle, it is possible by means of a suitable dimensioning of the scanning graduations 23.1, 23.2 in the scanning plate 23 to generate Vernier fringe patterns, which have different Vernier periods $\Lambda$, on the two incremental signal detector arrangements 24.1, 24.2. However, the generation of identical Vernier periods $\Lambda$ offers definite advantages. It is then for example possible to use incremental signal detector arrangements 24.1, 24.2, which are identically designed, for the coarse and fine incremental signals.

Figure 1F:
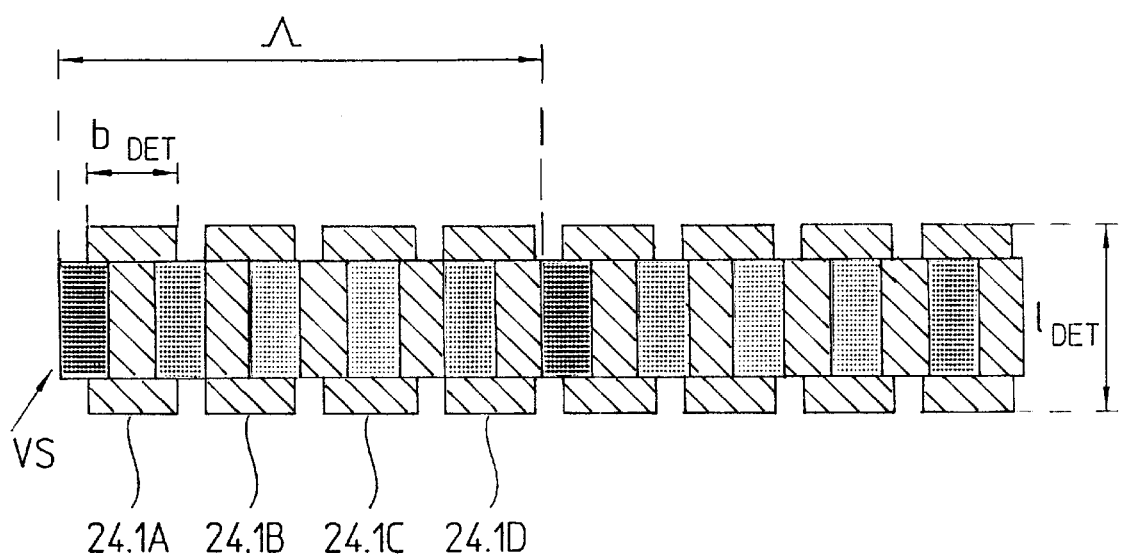
FIG. 1f shows a portion of an embodiment of a detector arrangement shown in FIG. 1e, as well as the Vernier fringe pattern scanned by the detector arrangement.

In the end, the Vernier fringe pattern VS represented in FIG. 1f results from the selected design of the incremental track 12 on the scale 10 and represents the superimposition of a resulting purely Vernier fringe pattern from the scanning of the fine graduation period $TP_2$ and of a cast shadow pattern from the scanning of the coarse graduation period $TP_1$.

In order to obtain, in accordance with the invention, the desired incremental signals INC1, INC2 with different signal periods SP1, SP2 from the Vernier fringe patterns VS on the two incremental signal detector arrangements 24.1, 24.2, a number of further measures are provided for the device of the invention. These measures, explained in what follows, are used inter alia for the filtering of signal portions of the periodicity SP2 out of the incremental signal INC1, and of signal portions of the periodicity SP1 out of the incremental signal INC2. This means that by these measures it is assured that the individual incremental signals INC1, INC2 are generated without being affected by the respectively other signal. The respectively undesired signal portions are suitably filtered out.

Thus, in this exemplary embodiment, steps are provided on the part of the scanning graduation 23.1 which causes the filtering of undesired signal portions from the coarse incremental signal INC1. For example, such signal portions can result from the simultaneous scanning of the finer graduation period $TP_2$ and can interfere with the incremental signal INC1. Such interference is particularly disadvantageous if it is intended to further divide, or interpolate, the coarse incremental signal INC1 later, for which as a rule the best possible optimal shape, i.e. a sine- or cosine-shape, of the scanning signals is a prerequisite. For such filtering the scanning graduation 23.1, which is designed as an amplitude grating, is provided with filtering properties. Known filtering processes are being employed for this and, for example, the transparent partial areas of the scanning graduation 23.1 are designed with cosine-shaped openings, such as known from GB 2 116 313 A, for example. Alternatively, filtering of the harmonic wave portion of the periodicity SP2 could also be assured in a known manner by the suitable displacement of the strips of the scanning graduation 23.1, i.e. different known measures are available for filtering this signal portion.

Advantageously, further rules regarding the dimensions should be observed for assuring the generation, which is as free as possible of interferences, of incremental signals INC2 with the finer signal period SP2.

Thus, the width $b_{DET}$ of a single detector element 24.2A, 24.2B, ... in the detector arrangement 24.2, which is used for generating the incremental signal INC2 with the finer signal period SP2, is selected in accordance with the equation $$b_{DET}=n*TP_1 \qquad \text{(Equ. 1),}$$

wherein n=1, 2, 3, ...

This means that the width $b_{DET}$ of a single detector element 24.2A, 24.2B, ... of this detector arrangement is in the end selected to be a whole-number multiple of the coarse graduation period $TP_1$ in the incremental track. In the present case, n=1 applies. It is assured by this dimensioning rule that possible offset fluctuations of the periodicity SP1 are prevented in the course of generating the fine incremental signal INC2 with the aid of the incremental signal detector arrangement 24.2.

Moreover, in the present exemplary embodiment, the detector elements 24.1A, 24.1B of the detector arrangement 24.1 for generating the incremental signal INC1 with the coarse signal period SP1 are also designed to be wide in the same way, however, in principle this is not required.

Furthermore, in case of a relative movement between the scale and the scanning unit, the incremental signal detector arrangement 24.2 provides incremental signals INC2 with the fine signal period SP2 without any further measures being required, however, their amplitude is modulated with the coarse signal period SP1.

Figure 1G:
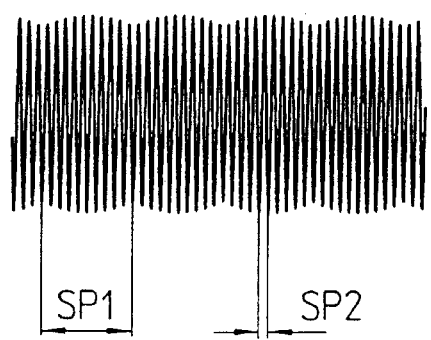
FIG. 1g represents the scanning signals detected by an incremental signal detector arrangement according to the present invention.

A representation of such an incremental signal is shown in FIG. 1g. However, for dependable further processing of the fine incremental signals INC2, the most even amplitude of these signals possible is advantageous. To assure this, the Vernier period $\Lambda$ of the Vernier fringe pattern VS in accordance with the equation $$\Lambda=(2*m+1)*TP_1, \qquad \text{(Equ. 2),}$$

wherein m=1, 2, 3, ..., is therefore preferably selected.

In addition, in this case the width of the blocks B1 and B2 in the incremental track should be selected to be identical in the measuring direction x, in contrast to the example in FIG. 1b.

In the present example, m=2 was selected from which, at $TP_1$=200 μm, a required Vernier period $\Lambda$=1 mm results in the detection plane. In principle, the required Vernier period $\Lambda$ can be definitely set by means of the selection of different graduation periods for the scale and the scanning graduations.

By means of this selection of the Vernier period $\Lambda$ and the push-pull, or differential, connection of those detector elements which have output signals with a relative phase shift of 180, the above mentioned undesired amplitude modulation of the fine incremental signal INC2 mentioned above can be eliminated. Here, the formation of the difference finally takes place from the respective partial incremental signals which stem from the inversely designed areas of the coarse graduation period $TP_1$ of the incremental track 12. The undesired amplitude modulations of the partial incremental signal then cancel each other out. Incremental signals of constant amplitude are then present on the output side.

It is moreover also possible to eliminate, or at least minimize, undesired harmonic portions of the higher resolving incremental signal INC2 by known filtering methods. In this case such filtering methods must be provided either for the scanning graduation 23.2, or for the detector arrangement 24.2.

The discussed measures now assure that it is possible to dependably obtain the incremental signals INC1, INC2 with different signal periods SP1, SP2 by scanning the incremental track 12. In this embodiment of the position measuring system in accordance with the invention it is possible in a known manner to assure the high-resolution position determination by the combination with the coarse absolute position signal ABS from the absolute track 13.

As already mentioned above, the different scanning signals can already be suitably combined with each other in the device of the invention, in order to precisely determine the respectively actual absolute position. But it is also possible to transmit the various scanning signals to a downstream-connected evaluation unit, where the determination of the absolute position, etc., from these signals takes place.

A second embodiment of the device in accordance with the present invention will be described in what follows by means of FIGS. 2a to 2e. In this case, only the essential differences with respect to the first embodiment will be addressed, i.e. identical components of the device essentially have the same functions, unless possible differences are explained in what follows. This embodiment of the position measuring system in accordance with the present invention again is a device for absolute position determination which, besides an incremental tracks being scanned in accordance with the invention, furthermore has a serially coded absolute track.

FIG. 2a again shows the basic scanning beam path in the second exemplary embodiment of the position measuring system in accordance with the present invention. But the differences with the first variation in the way the incremental signals are generated cannot be seen in this representation. In contrast to the first exemplary embodiment in FIGS. 1a to 1f, it is now no longer provided to detect the two incremental signals INC1, INC2 with the different signal periods SP1, SP2 by two spatially separated incremental signal detector arrangements, instead a modified common incremental signal detector arrangement 240.1 of the detector unit 240 is to be used.

Regarding the scanning beam course for generating the absolute position signals ABS and the structure of the absolute position signal detector arrangement 240.3, there are no differences with the first variation, therefore reference is made only to the above explanations.

However, differences with the above explained variation exist in connection with various measures which are of importance in regard to the generation of the different incremental signals INC1, INC2.

Figure 2A:
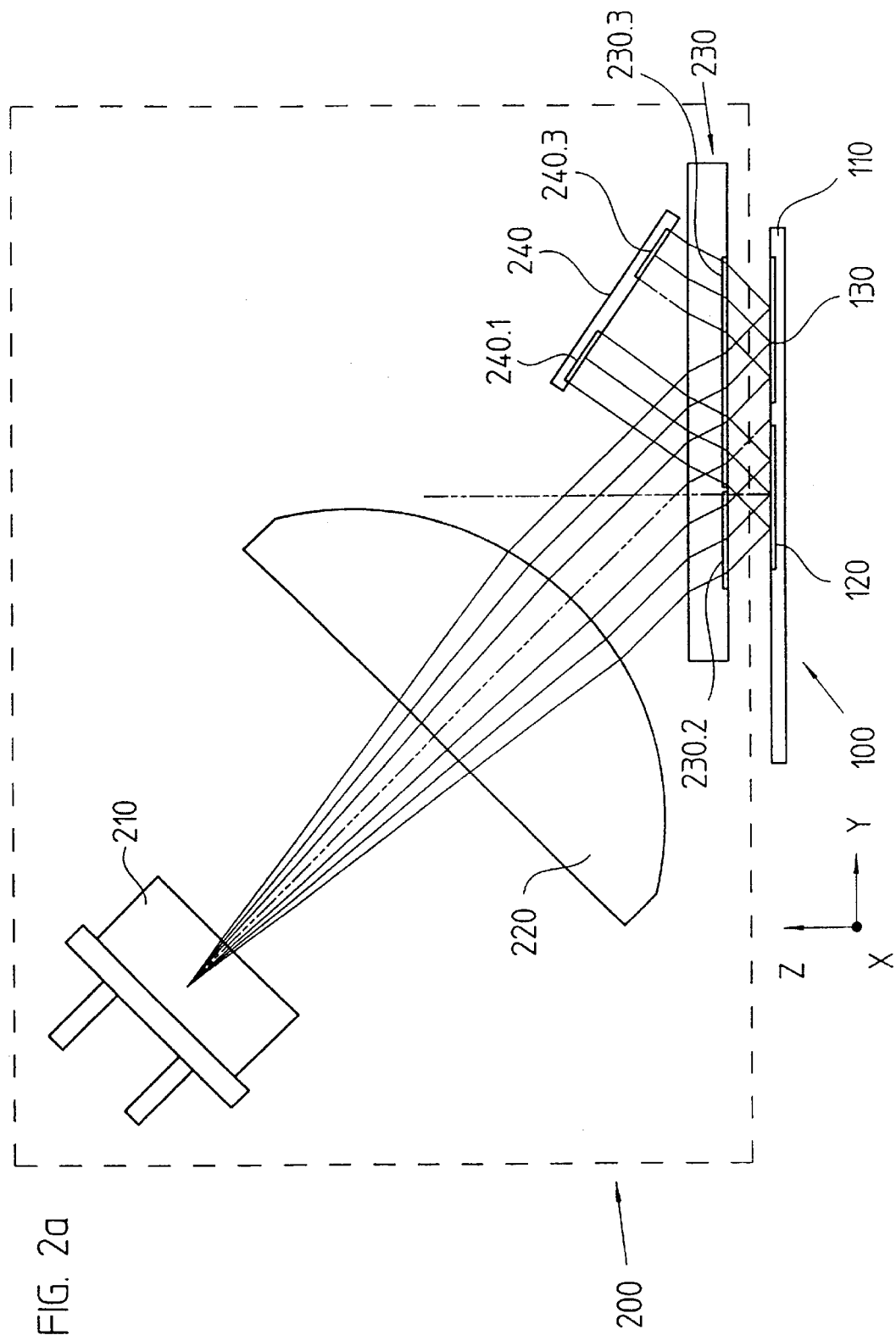
FIG. 2a is a schematic representation of the path of the scanning beams in a second exemplary embodiment of the position measuring system according to the present invention.
Figure 2B:
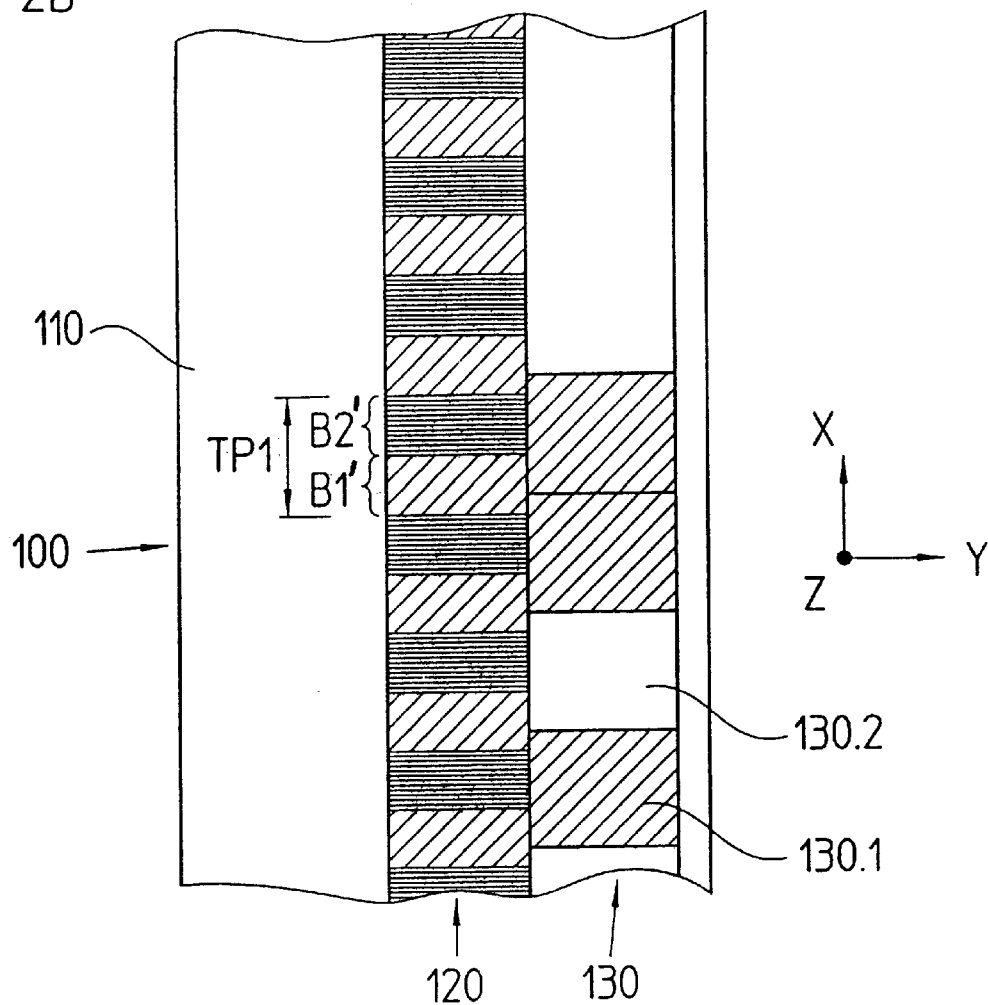

Thus, it can be seen in FIG. 2a that there is a somewhat modified embodiment of the incremental track 120 on the scale 100, because the blocks B1', B2' of this track now have the same width in the measuring direction x. The coarse graduation period $TP_1$ results from the sum of these widths which, however, as a whole has been selected to be identical with the graduation period $TP_1$ in the above example, i.e. $TP_1$=200 μm. The blocks B2' are structured the same as in the first exemplary embodiment. Here, again the fine graduation period $TP_1$ in the blocks B2' has been selected in accordance with $TP_1$=20 μm.

Figure 2C:
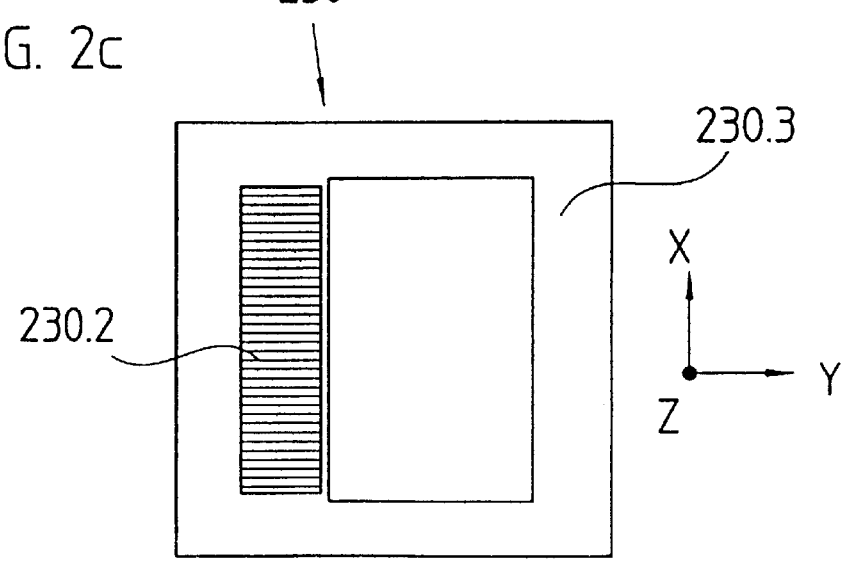
Figure 2D:
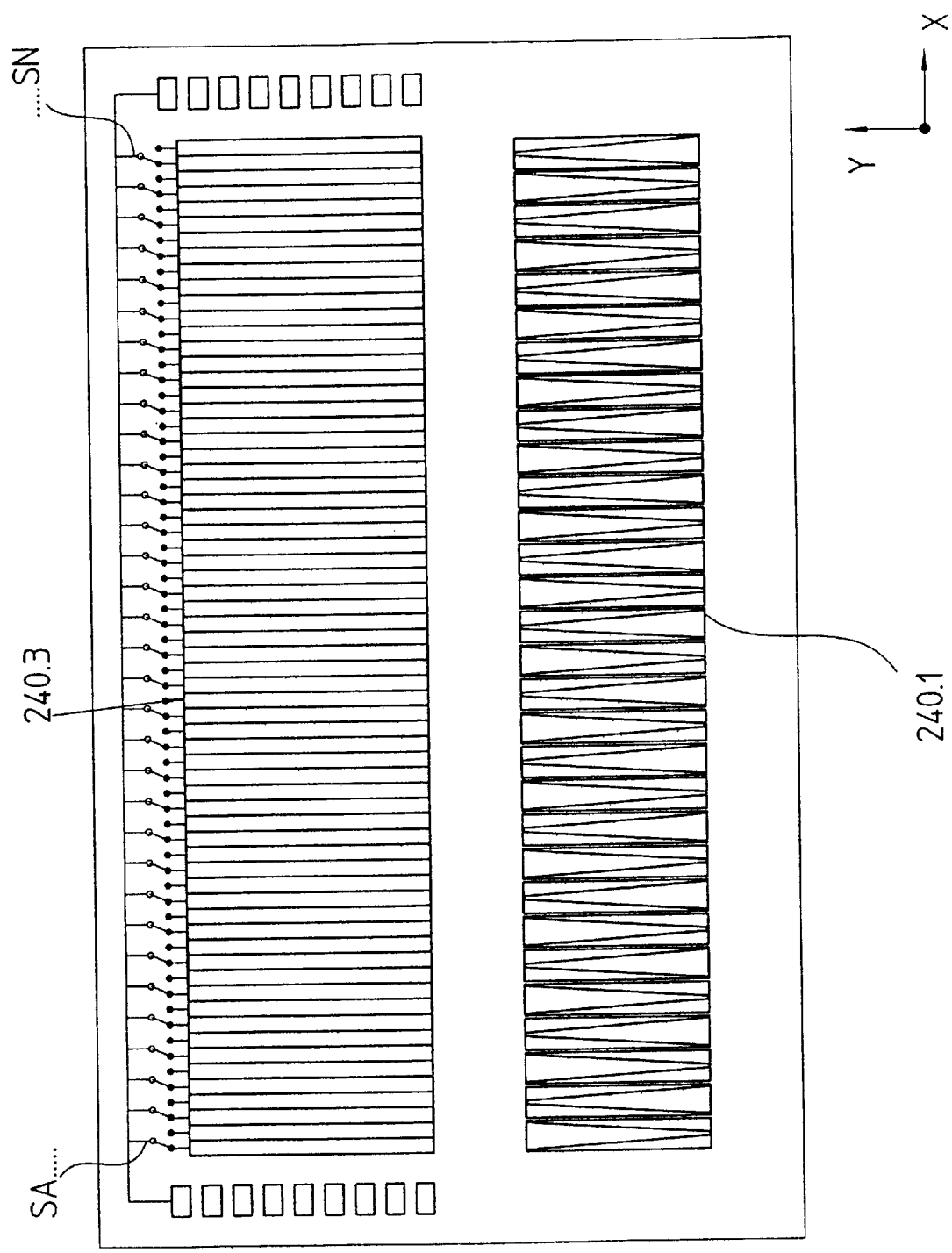

As can be seen in FIG. 2c, in contrast to the above example, there is now only a single scanning graduation 230.2 arranged next to the transparent window area 230.3, and it has a similar length in the measuring direction x as the transparent window area 230.3. The scanning graduation 230.2 is designed identically to the scanning graduation 23.2 in the above sample, which was only used there for generating the high-resolution incremental signals INC2. Therefore the scanning graduation 230.2 in this example has a scanning graduation period $ATP_2$, which is slightly different from the finer graduation period $TP_2$=20 μm of the incremental track 120. The single scanning graduation 230.2 of this variation is embodied the same as the scanning graduation 23.2 in the first exemplary embodiment, namely as a combined phase/amplitude structure as proposed in German Patent Application 199 41 318.5 of Applicant.

Only a single Vernier strip system VS' at the position of the incremental signal detector arrangement 240.1 exists in the detection plane of the detector unit 240 for generating the two incremental signals INC1, INC2 with the different signal periods SP1, SP2. As can be seen from the schematic plan view of the detection plane in FIG. 2d, only a single incremental signal detector arrangement 240.1 is therefore provided, by which the Vernier fringe pattern is scanned in this plane for generating the two incremental signals INC1, INC2.

Figure 2E:
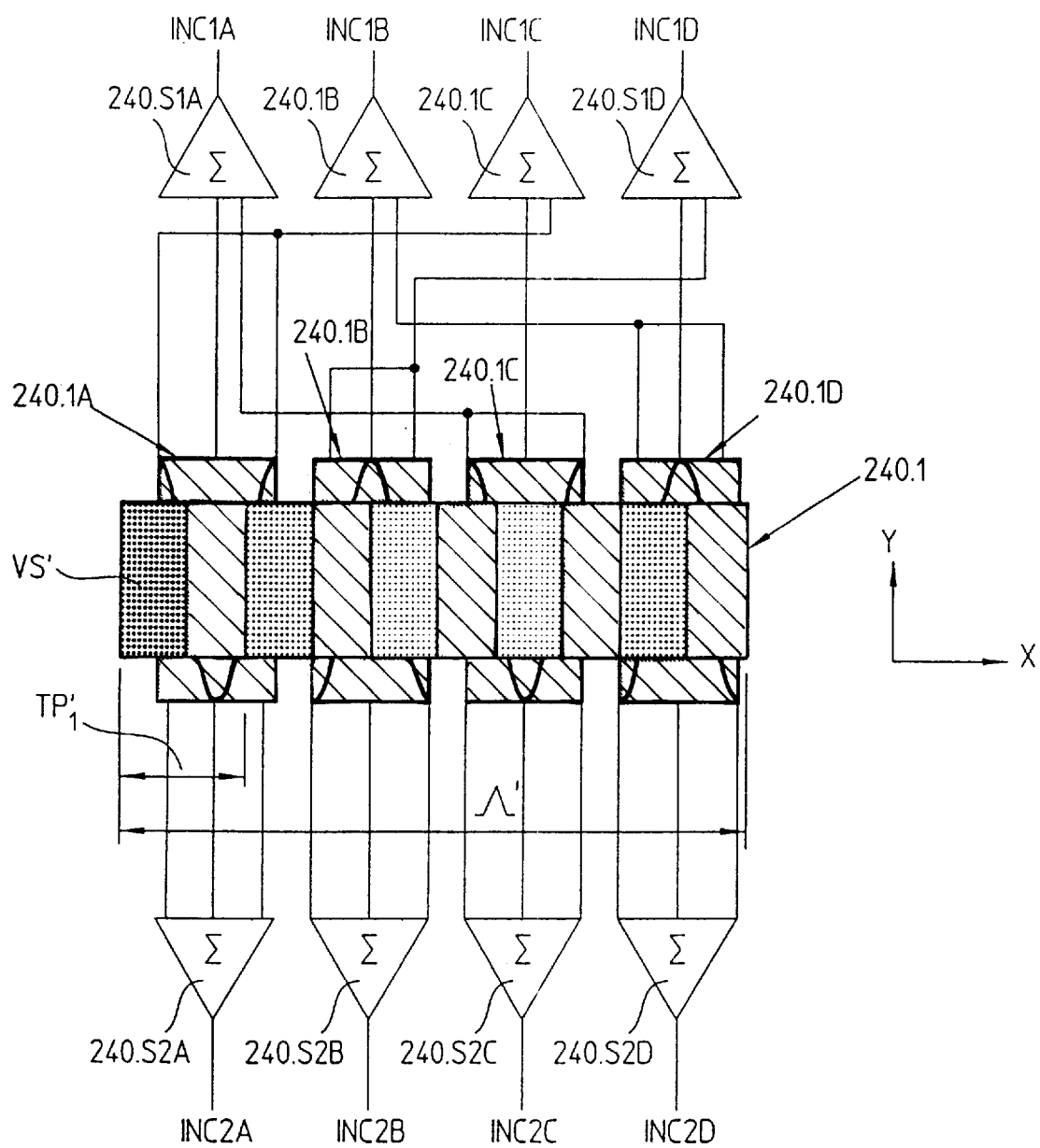
FIG. 2e is a plan view of a portion of the detection plane of the embodiment of the scanning unit of the position measuring system shown in FIG. 2a, as well as the fringe pattern scanned by the scanning unit.

For the detailed explanation of the single incremental signal detector arrangement 240.1 provided in this example and for the generation of the two incremental signals INC1, INC2, reference is made to FIG. 2e, which shows a section of the incremental signal detector arrangement 240.1, as well as the Vernier fringe pattern VS', which has the Vernier period Λ' and which is scanned by it. The same as in the example already explained above, on the one hand the scanned Vernier fringe pattern VS' has the Vernier period Λ', which is the end result of scanning the graduation period $TP_2$. Moreover, again a pattern of a periodicity $TP_1$ is superimposed on this Vernier fringe pattern VS', wherein the periodicity $TP_1$ is clearly less than the Vernier period Λ'.

Only a small section of the incremental signal detector arrangement 240.1 is represented in FIG. 2e, which only extends over one Vernier period Λ'. A multiply repeated sequence of the represented section, extending in the measuring direction x, is provided in actual use.

Figure 2F:
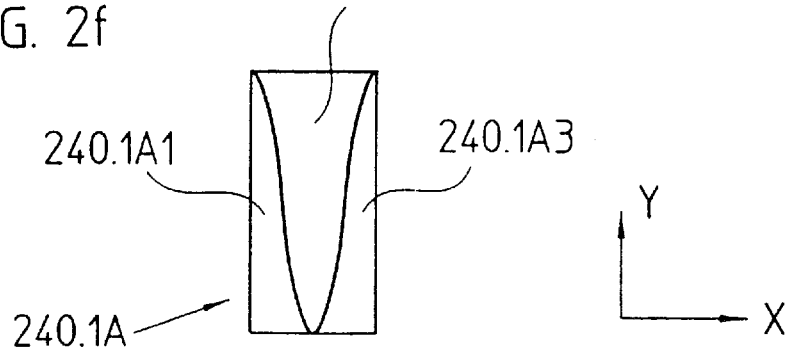
FIG. 2f is an enlarged plan view of an embodiment of a detector element used in the embodiment of an incremental signal detector arrangement shown in FIG. 2e.

In this embodiment, the periodically arranged detector elements 240.1A, ... 240.1D provided in the incremental signal detector arrangement 240.1 now have such an interior structure that each detector element 240.1A, ... 240.1D in turn includes a total of three individual partial detector elements 240.1A1, 240.1A2, 240.1A3, as represented in an enlargement in FIG. 2f for the detector element 240.1A. The geometrical shape of the individual partial detector elements 240.1A1, 240.1A2, 240.1A3 has been selected here in such a way that a defined filtering effect results in the course of scanning the coarse graduation period $TP_1$. For this purpose, on the one hand, the width of each detector element 240.1A, ... 240.1D is selected to be equal to the coarse graduation period $TP_1$. On the other hand, the inner partial detector element 240.1A2 and the combination of the respectively outer partial detector elements 240.1A1, 240.1A3 have cosine-shaped boundary lines. The period of the respective cosine function has been selected to be identical with the coarse graduation period $TP_1$.

The detector element 240.1B adjoining the detector element 240.1A also includes three partial detector elements, wherein the arrangement of the three partial detector elements in this exemplary embodiment is provided to be turned by 180. The next detector element 240.1C is again designed identical to the first detector element 240.1A, while the fourth detector element 240.1D again is designed the same as the second detector element 240.1B.

By the selected shaping of the partial detector elements 240.1A1, 240.1A2, 240.1A3 it is possible to assure in a known manner a filtering of undesired signal portions at the detector. This is necessary in this exemplary embodiment since, in contrast to the previous variation, only a single scanning graduation is provided, which does not have an implicit filter effect. As has been explained above, filtering of the resulting scanning signal is required for generating the coarse incremental signal INC1 in order to eliminate, inter alia, signal portions which stem from the finer graduation period $TP_2$ in the incremental track. While in the above example this took place by appropriate filtering measures at the scanning graduation 23.1, in this example the same filtering effect is now caused by the geometric layout of the partial detector elements 240.1A1, 240.1A2, 240.1A3.

It is of course possible to cause this desired filtering effect at the detector by means of alternative geometries of the partial detector elements 240.1A1, 240.1A2, 240.1A3. In this case a multiple sequential arrangement of such partial detector elements in the y-direction, etc. is possible.

For generating the fine partial incremental signals $INC2_A$, ... $INC2_D$, the various partial detector elements 240.1A1, 240.1A2, 240.1A3 are connected with each other in the way represented in the lower portion of FIG. 2e. This means that the respective scanning signals of three partial detector elements 240.1A1, 240.1A2, 240.1A3 of a detector element 240.1A are added together, which takes place with the aid of suitable summing elements 240.S1A, ... 240.S1D. The fine partial incremental signals $INC2_A$, ... $INC2_D$ present at the outputs of the summing elements 240.S1A, ... 240.S1D which have the identical phase relationships, are also combined and added in such a way that in the end the four fine partial incremental signals $INC2_A$, ... $INC2_D$, respectively phase-shifted by 90, are present at the output and are further processed in a known manner.

For generating the coarse partial incremental signals $INC1_A$, ... $INC1_D$, the wiring together of the different partial detector elements 240.1A1, 240.1A2, 240.1A3 of the individual detector elements 240.1A, ... 240.1D takes place in the way represented in the upper part of FIG. 2e. A constant amplitude of the resulting incremental signals $INC1_A$, $INC1_D$ in particular is again assured here because of the selected wiring. For this purpose, respectively three specifically selected partial detector elements are connected together, or added together via the summing elements 240.S2A, ... 240.S2D, for generating an incremental signal $INC1_A$, ... $INC1_D$ at the output. For example, for generating the incremental signal $INC1_A$, the center partial detector element 240.1A2 of the detector element 240.1A and the two outer partial detector elements 240.1C1, 240.1C3 of the detector element 240.1C are wired together, etc. In this case, the selection of the partial detector elements to be wired together takes place with the point of view that the incremental signal INC1 resulting from this should have a constant signal amplitude. For this purpose, respectively three partial detector elements are therefore wired, or summed, together, which register identical areas of the cast shadow pattern with the period $TP_1$ in the Vernier fringe pattern VS' which, however, occur at locally different positions in the Vernier fringe pattern VS', in particular at complementary first and second positions of the Vernier fringe pattern. For example, the partial detector element 240.1A2 essentially registers a dark area of the cast shadow pattern at a first position of the Vernier fringe pattern VS'. The two partial detector elements 240.1C1, 240.1C3 also register dark areas of the cast shadow pattern, but at a second position of the Vernier fringe pattern, which is offset by half a Vernier strip period and at which a Vernier fringe pattern complementary to the first position is present. The wiring of the remaining detector elements takes place analogously with these considerations. Finally, the desired amplitude constancy of the coarse incremental signals $INC1_A$, ... $INC1_D$ at the output results by adding the different signals together.

As already indicated several times, the present invention is of course not limited to the two explicitly explained exemplary embodiments, i.e. there are also alternative execution variations within the framework of the present invention. For example, it is possible to provide different whole-number relationships between the graduation periods $TP_1$, $TP_2$ in the incremental track. In the same way other relationships can of course also be provided between the graduation periods $TP_1$, $TP_2$ of the incremental track and the respective bit width in the absolute track.

Moreover, there is the possibility of arranging or integrating a variety of components for signal processing, or signal editing, on the detector side directly on the appropriate carrier substrate. These can be switches, trigger stages, current/voltage converters, etc., for example.

It is also possible to provide, alternatively to the Vernier fringe pattern, for the generation of a Moiré fringe pattern in a known manner and to scan it.

Finally, it is also possible within the framework of the present invention to operate not only with a strictly collimated illumination, but also with a divergent illumination. In this case it is necessary, in addition to the above explained considerations, to observe appropriate enlargement factors when dimensioning the respective detector arrangement.

Moreover, alternative variations can also be produced, which only include a single incremental track at the scale, for example, which provides two incremental signals of different periodicity in the course of scanning, etc.

The foregoing description is provided to illustrate the invention, and is not to be construed as a limitation. Numerous additions, substitutions and other changes can be made to the invention without departing from its scope as set forth in the appended claims.

We claim:

1. A position measuring system comprising:
    a scale comprising an incremental track, which extends in a measuring direction and comprises an incremental graduation with two different graduation periods;
    a scanning unit which moves in relation to the scale in a measuring direction, the scanning unit comprises an incremental signal detection arrangement;
    wherein the incremental signal detection arrangement generates incremental signals with a first coarse signal period and generates incremental signals with a second finer signal period.

2. The position measuring system in accordance with claim 1, wherein the scale further comprises an absolute track arranged parallel with the incremental track, and the absolute track comprises an absolute coding, and
    the scanning unit further comprises an absolute signal detection arrangement that generates an absolute position signal.

3. The position measuring system in accordance with claim 2, wherein the incremental track comprises a first incremental graduation with a coarse graduation period and a second incremental graduation with a fine graduation period, and wherein the graduation periods have a whole-number relationship with respect to each other.

4. The position measuring system in accordance with claim 3, wherein the incremental track comprises periodically successive first and second blocks in the measuring direction, which are arranged in the grid of the coarse graduation period.

5. The position measuring system in accordance with claim 4, wherein the second blocks each has periodically succeeding partial areas in the measuring direction with different optical properties, which are arranged in the grid of the fine graduation period.

6. The position measuring system in accordance with claim 5, wherein the first blocks are optically high-reflecting or low-reflecting, and the partial areas in the second blocks are embodied to be alternatingly optically high-reflecting or low-reflecting.

7. The position measuring system in accordance with claim 5, wherein the partial areas in the second blocks with different optical properties are arranged in such a way, that in connection with the first and second blocks along the measuring direction it is always assured, that partial areas with different optical properties are alternatingly arranged.

8. The position measuring system in accordance with claim 3, wherein the absolute track is designed as a serial code structure having a bit width corresponding to the coarse graduation period of the first incremental graduation.

9. The position measuring system in accordance with claim 2, wherein the absolute position signal detector arrangement comprises a plurality of detector elements, which adjoin each other in the measuring direction and are each identically designed, and wherein a circuit element is assigned to respectively two or more detector elements assigned to one bit width, by which a selective read-out of respectively one detector element is possible.

10. The position measuring system in accordance with claim 2, wherein the scanning unit furthermore comprises a light source, as well as a scanning plate with one or several scanning graduations and a transparent window area.

11. The position measuring system in accordance with claim 3, wherein the scanning unit comprises a first and a second scanning graduation with different scanning graduation periods, which are matched to the coarse and the fine graduation periods of the first and second incremental graduations, respectively, so that respective Vernier fringe patterns result in a detection plane.

12. The position measuring system in accordance with claim 10, wherein the scanning plate comprises a first and a second scanning graduation with different scanning graduation periods, which are matched to the coarse and the fine graduation periods of the first and second incremental graduations, respectively, so that respective Vernier fringe patterns result in a detection plane.

13. The position measuring system in accordance with claim 11, wherein the first scanning graduation is matched to the coarse graduation period and is embodied purely as an amplitude structure, and the second scanning graduation is matched to the fine graduation period and is embodied as a combined phase-amplitude structure.

14. The position measuring system in accordance with claim 13, wherein the first scanning graduation is embodied so that a filtering of undesired signal portions results, in particular of those signal portions with the finer signal period.

15. The position measuring system in accordance with claim 11, wherein the incremental signal detector arrangement comprises a first and a second incremental signal detector arrangement, which are arranged spatially separated from each other, and the first and second incremental signal detector arrangements are each embodied as structured detector arrangements comprising a plurality of individual detector elements, which are arranged adjoining each other in the measuring direction, and wherein those detector elements in each incremental signal detector arrangement, which provide output signals of identical phase, are connected with each other.

16. The position measuring system in accordance with claim 15, wherein every fifth one of the adjoining plurality of individual detector elements are connected with each other, so that four partial incremental signals per incremental signal detector arrangement result, which respectively have a phase shift of 90 with respect to each other.

17. The position measuring system in accordance with claim 15, wherein the width $b_{DET}$ of at least one of the plurality of individual detector elements is selected in the measuring direction in accordance with:

$$b_{DET}=n*TP_1,$$

with n=1, 2, 3, ..., and $TP_1$=the coarse graduation period of the first incremental graduation.

18. The position measuring system in accordance with claim 11, wherein the Vernier fringe pattern has a Vernier period (Λ), which is selected in accordance with:

$$\Lambda=(2*m+1)*TP_1,$$

with m=1, 2, 3, ..., and $TP_1$=the coarse graduation period of the first incremental graduation.

19. The position measuring system in accordance with claim 3, wherein the scanning unit comprises a single scanning graduation, which is matched to the fine graduation period, so that a Vernier fringe pattern with the Vernier period Λ' results in a detection plane.

20. The position measuring system in accordance with claim 10, wherein the scanning plate comprises a single scanning graduation, which is matched to the fine graduation period, so that a Vernier fringe pattern with the Vernier period Λ' results in a detection plane.

21. The position measuring system in accordance with claim 19, wherein the single scanning graduation is embodied as a combined phase-amplitude structure.

22. The position measuring system in accordance with claim 19, wherein the incremental signal detection arrangement comprises a single incremental signal detection arrangement, which is embodied as a structured detection arrangement comprising a plurality of individual detector elements, which are arranged adjoining each other in the measuring direction.

23. The position measuring system in accordance with claim 22, wherein each of the plurality of individual detector elements has an inner structure and comprises several partial detector elements, whose geometric shape has been selected to be such that a defined filter effect results therefrom.

24. The position measuring system in accordance with claim 19, wherein the width $b_{DET}$ of at least one of the plurality of individual detector element is selected in the measuring direction in accordance with:

$$b_{DET}=n*TP_1,$$

with n=1, 2, 3, ..., and $TP_1$=the coarse graduation period of the first incremental graduation.

25. The position measuring system in accordance with claim 18, wherein a Vernier period Λ' is selected in accordance with $$\Lambda'=(2*m+1)*TP_1,$$

with m=1, 2, 3, ..., and $TP_1$=the coarse graduation period of the first incremental graduation.

26. The position measuring system in accordance with claim 23, wherein every third one of the several partial detector elements of a detector element are connected via a summing element for generating the fine incremental signals.

27. The position measuring system in accordance with claim 23, wherein three partial detector elements of different detector elements are connected via a summing element for generating the incremental signals with a first coarse signal period, and the selection of the respective partial detector elements takes place in such a way that the resulting incremental signals have a constant signal amplitude.

* * * * *